United States Patent [19]
Ikata et al.

[11] Patent Number: 6,023,204
[45] Date of Patent: Feb. 8, 2000

[54] PACKAGED SURFACE ACOUSTIC WAVE FILTER CHIPS UTILIZING AN ON-CHIP RELAY TERMINAL

[75] Inventors: Osamu Ikata; Yoshio Satoh; Takashi Matsuda; Jun Tsutsumi; Satoshi Miyamoto, all of Kawasaki, Japan

[73] Assignee: Fujitsu Limited, Kawasaki, Japan

[21] Appl. No.: 09/153,335

[22] Filed: Sep. 15, 1998

[30] Foreign Application Priority Data

May 14, 1998 [JP] Japan .................................. 10-131979

[51] Int. Cl.[7] .................................. H03H 9/64; H03H 9/10
[52] U.S. Cl. .......................... 333/193; 333/194; 310/348; 310/313 B
[58] Field of Search ..................... 333/193–196, 333/133; 310/313 R, 313 B, 313 C, 313 D, 348

[56] References Cited

U.S. PATENT DOCUMENTS 5,438,305  8/1995  Hikita et al. ..................... 333/193 X
5,604,393  2/1997  Suzuki et al. .................... 333/193 X
5,721,519  2/1998  Onishi et al. ...................... 333/193
5,874,869  2/1999  Ueda et al. ........................ 333/193

FOREIGN PATENT DOCUMENTS

5-63503   3/1993  Japan .................................. 333/193
6-152299  5/1994  Japan .................................. 333/193

*Primary Examiner*—Robert Pascal
*Assistant Examiner*—Barbara Summons
*Attorney, Agent, or Firm*—Staas & Halsey, LLP

[57] ABSTRACT

A surface acoustic wave device includes a plurality of surface acoustic wave filter chips having external connection terminals and a package accommodating the plural surface acoustic wave filter chips. The package is provided with a plurality of terminals for connection with the surface acoustic wave filter chips, and one of the external connection terminals of a first one of the surface acoustic wave filter chips is connected with one of the terminals of the package via a second one of the surface acoustic wave filter chips.

6 Claims, 11 Drawing Sheets

FIG. 9

PACKAGED SURFACE ACOUSTIC WAVE FILTER CHIPS UTILIZING AN ON-CHIP RELAY TERMINAL

CROSS-REFERENCE TO RELATED APPLICATION

This application is related to Japanese application No. HEI 10(1998)-131979, filed on May 14, 1998, whose priority is claimed under 35 USC §119, the disclosure of which is incorporated by reference in its entirety.

BACKGROUND OF THE INVENTION

1. Field of the Invention

The present invention relates to a surface acoustic wave (hereinafter referred to as SAW in abbreviation) device, particularly to structure of a SAW device such as a SAW filter for use in mobile communication equipment.

2. Description of Related Art

Recently, with development of mobile communication systems, portable phones, portable information terminals and the like have been getting widespread rapidly. Miniaturization of such terminal equipment with improved performance is under active research and development. Now, both an analog system and a digital system are in use for portable phones, and their radio frequency in use covers wide bands from 800 MHz to 1 GHz and from 1.5 GHz to 2.0 GHz, and their intermediate frequency in use from 40 MHz to 400 MHz as usual.

In conventional SAW filters, a filter circuit having desired pass characteristics is formed on one chip. The chip is accommodated in one package.

In recent years, however, communication systems of various types are put into practice in the field of mobile communication technology. As a result, a terminal is required to be compatible with a plurality of systems. Accordingly, the development of circuits and terminals capable of plural systems has now become vigorous, and dual SAW filters are becoming in use. For example, SAW devices have been developed which are so constructed that two SAW filter circuits are formed on one chip which is then accommodated in one package or that two filters each with one SAW filter circuit formed thereon are accommodated in one package and the like.

In such circumstances, for the development of SAW filters compatible with more and more diversified systems, a SAW filter package should be designed to accommodate as many SAW filter chips as possible therein.

In some cases, one package needs to accommodate several SAW filters having different parameters. The parameters include center frequency, pass band width and the like.

Further, it is required to consider whether external output/input terminals should be of balanced type or of unbalanced type, whether one package should accommodate SAW filters having input/output terminals of both types or the like.

As the number of SAW filter chips increases, external connection terminals for input and output on the plural SAW filter chips are connected with many terminals for connection mounted on the package accommodating the filter chips, in much more complicated way.

For example, conventionally, the connection terminals mounted on the package are connected with the external connection terminals on the filter chips by wire bonding, i.e., the terminals are directly connected by aerial wiring using a lot of metallic wires. The connection terminals on the package must be arranged in such a manner that these wires do not contact each other. This complication in arranging the connection terminals may result in a decline in productivity, limitations in designing the connection terminals on the package and electrodes formed on the filter chip and the like.

Further, where the connection terminals on the package are connected with the external connection terminals on the filter chips by wire bonding, there rise such problems that unnecessary radio wave may be generated from the wires (aerial wiring), that resistance of the wires or the like may affect characteristics of the SAW filter, and especially, that an attenuation characteristic out of the pass band may decline.

SUMMARY OF THE INVENTION

The present invention provides a SAW device including a plurality of SAW filter chips having external connection terminals and a package accommodating the plural SAW filter chips, wherein the package is provided with a plurality of terminals for connection with the SAW filter chips, and one of the external connection terminals of a first one of the SAW filter chips is connected with one of the terminals for connection of the package via a second one of the SAW filter chips which is different from the first SAW filter chip.

DESCRIPTION OF THE PREFERRED EMBODIMENTS

In the SAW device of the present invention, said one of the external connection terminals of the first SAW filter chip may be connected with said one of the terminals of the package via a relay terminal mounted on the second SAW filter chip.

Here, all the plural SAW filter chips may be composed of band pass filters.

All the plural SAW filter chips may have the same center frequency and the plural SAW filter chips may have at least two different pass band widths.

Alternatively, all the plural SAW filter chips may have the same pass band width and the plural SAW filter chips may have at least two different center frequencies.

Further, the plural SAW filter chips may have at least two different center frequencies and at least two different pass band widths.

The SAW device may be so constructed that at least one of the external connection terminals of at least one of the plural SAW filter chips is a terminal of balanced type.

In the present invention, the SAW filter chip is generally constructed to include an excitation electrode section for taking only electric signals within a desired frequency band as SAWs out of electric signals input from the outside and outputting the electric signals to the outside, and a terminal section having an input terminal for inputting electric signals from the outside to the excitation electrode section and an output terminal for outputting electric signals from the excitation electrode section to the outside.

The excitation electrode section is generally composed of a reflector and an interdigital transducer (hereinafter referred to as IDT) formed of electrode fingers which excite SAWs. For construction of such an excitation electrode section, a multi-mode filter as disclosed by Japanese Unexamined Patent Publication No. HEI 10(1998)-32463 may be used, for example. Alternatively, a transversal filter in which an IDT for input and an IDT for output are formed in parallel may be used for the excitation electrode section.

In the following description and the accompanying drawings, the construction of the excitation electrode section is shown rather simply for allowing the features of the invention to stand out for explanation. In practice, however, the excitation electrode section may be constructed similarly to the conventional multi-mode filter or transversal filter.

The external connection terminals mounted on the SAW filter chip include a terminal for inputting/outputting electric signals and a terminal for grounding. The location, shape and size of the terminals are set especially in view of the characteristics of the filter.

The connection terminals on the package are actually formed on an insulating layer on the package and include a terminal for inputting/outputting electric signals and a terminal for grounding. The insulating layer is formed, for example, along an end portion of the package. On the insulating layer, metal films to serve as the connection terminals are formed at spaced intervals. The location, shape and size of the connection terminals are set in view of the characteristics of the filter.

The package is made of ceramic or the like. A number of SAW filters are mounted on an inner surface of the package.

The plural SAW filters accommodated in one package may have the same characteristics or may have characteristics different from each other.

The cases where the filters have different characteristics include various cases. For example, the filters may be different in center frequency for signals which the filters allow to pass, the filters may be different in pass band widths, the filters may be different in center frequency and different pass band width.

EMBODIMENTS

Figure 1:
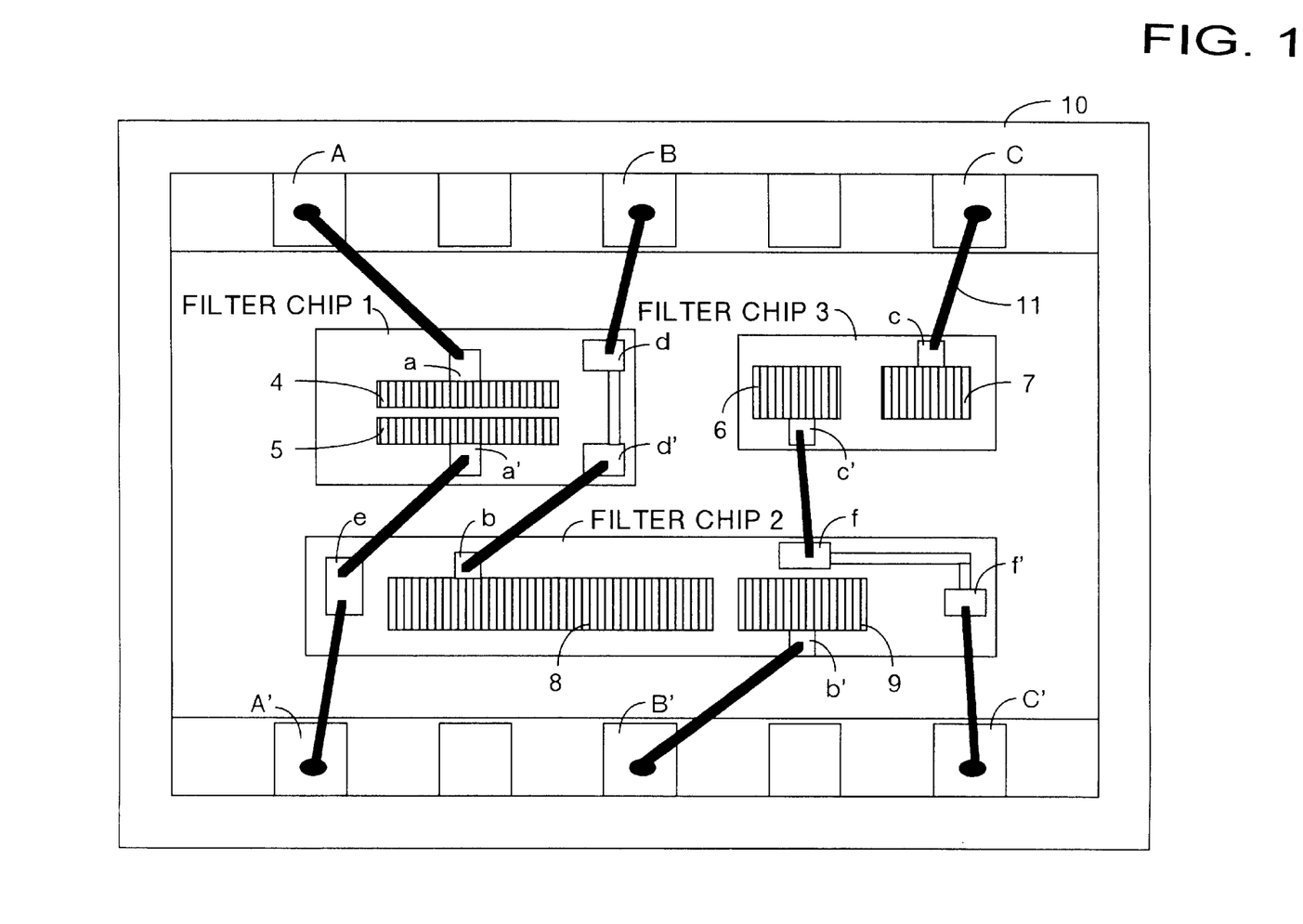
FIG. 1 is a schematic view illustrating a basic construction of a SAW device in accordance with the present invention.

FIG. 1 illustrates the construction of a SAW device in accordance with an embodiment of the present invention.

FIG. 1 is a plan view of the inside of a package 10 of the SAW device seen from above the package. Generally, a metallic cover 12 is formed on the top of the package, and therefore the inside of the package cannot be seen in usual use (see FIG. 2).

This embodiment shows a SAW device in which three SAW filter chips (1, 2, 3) are mounted in the package 10. The number of mounted SAW filter chips (referred to as filter chips hereafter), however, is not limited to three, but may be any plural number. Similarly, the size and location of the filter chips are not limited to those shown in FIG. 1, but filter chips may be formed in any size and location.

Reference symbols A, B, C, A', B' and C' and other squares in FIG. 1 represent connection terminals (terminals for inputting and outputting electric signals) on the package.

Reference numerals 4 to 9 denote excitation electrodes for selectively exciting input electric signals into SAWs having predetermined frequencies and passing only signals within a required pass band.

In the case where the filter chip is a multi-mode filter, the excitation electrode is composed of an IDT and a reflector. Various constructions in details have been proposed for such an excitation electrode. The selection of the most suitable IDT and the like may be done according to design requirements.

The reference symbols a, b, c, a', b' and c' on the filter chips are external connection terminals for connecting the excitation electrodes on the filter chips with the connection terminals (A, B, C, A', B', C') on the package and are electrically connected with the corresponding excitation electrodes.

In addition to the terminals for inputting and outputting electric signals, the connection terminals on the package includes other terminals for grounding, which are connected with the IDTs or the reflectors on the filter chips. But the terminals for grounding are omitted from FIG. 1 for highlighting the basic connection of the present invention. Connection of the terminals for grounding will be described later with reference to embodiments shown in FIG. 2 and the like.

In order to make the device function as a SAW device, the connection terminals (A, B, C, A', B', C') on the package are to be connected with the external connection terminals (a, b, c, a', b', c') on the filter chips. In the present invention, not all these terminals are connected directly with each other using wires, but some of them are connected with each other via relay terminals (d, d', e, f, f') on the filter chips as shown in FIG. 1. The connection terminals on the package are referred to as package terminals hereafter.

In the conventional technique, on the other hand, the connecting terminals (A, B, C, A', B', C')on the package are connected directly with the external connection terminals (a, b, c, a', b', c') on the filter chips using metal wires.

Referring to the filter chip 1 in FIG. 1, the package terminal A and the terminal a are connected directly using a wire 11 as in the conventional device. However, since there is another filter chip 2 between the package terminal A' and the terminal a', these terminals A' and a' are connected with each other via the relay terminal e mounted on the filter chip 2. In this case, the package terminal A and the relay terminal e as well as the terminal a' and the relay terminal e are connected directly using wires 11.

Referring to the filter chip 2 in FIG. 1, the package terminal B' and the terminal b' on the filter chip 2 are connected directly using a wire 11, but the package terminal B and the terminal b on the filter chip 2 are connected via the relay terminals d and d' mounted on the filter chip 1 and via a connection pattern formed between the relay terminals d and d'. Here, the package terminal B and the relay terminal d as well as the terminal b and the relay terminal d' are connected directly using wires 11.

Referring to the filter chip 3 in FIG. 1, the package terminal C and the terminal c on the filter chip 3 are connected directly using a wire 11, but the package terminal C' and the terminal c' on the filter chip are connected via the relay terminal f and f' mounted on the filter chip 2 and a connection pattern formed between the relay terminals f and f'. Here, the package terminal C' and the relay terminal f as well as the terminal c' and the relay terminal f are connected directly using wires 11.

By thus providing the relay terminals on the filter chips, the wires for connecting the terminals on the filter chips and the package terminals can be reduced in length and can also be prevented from contacting each other. The reduction of the length of the wires further suppresses generation of unnecessary radio waves, and as a results the characteristics of the SAW filter can be improved.

Figure 2:
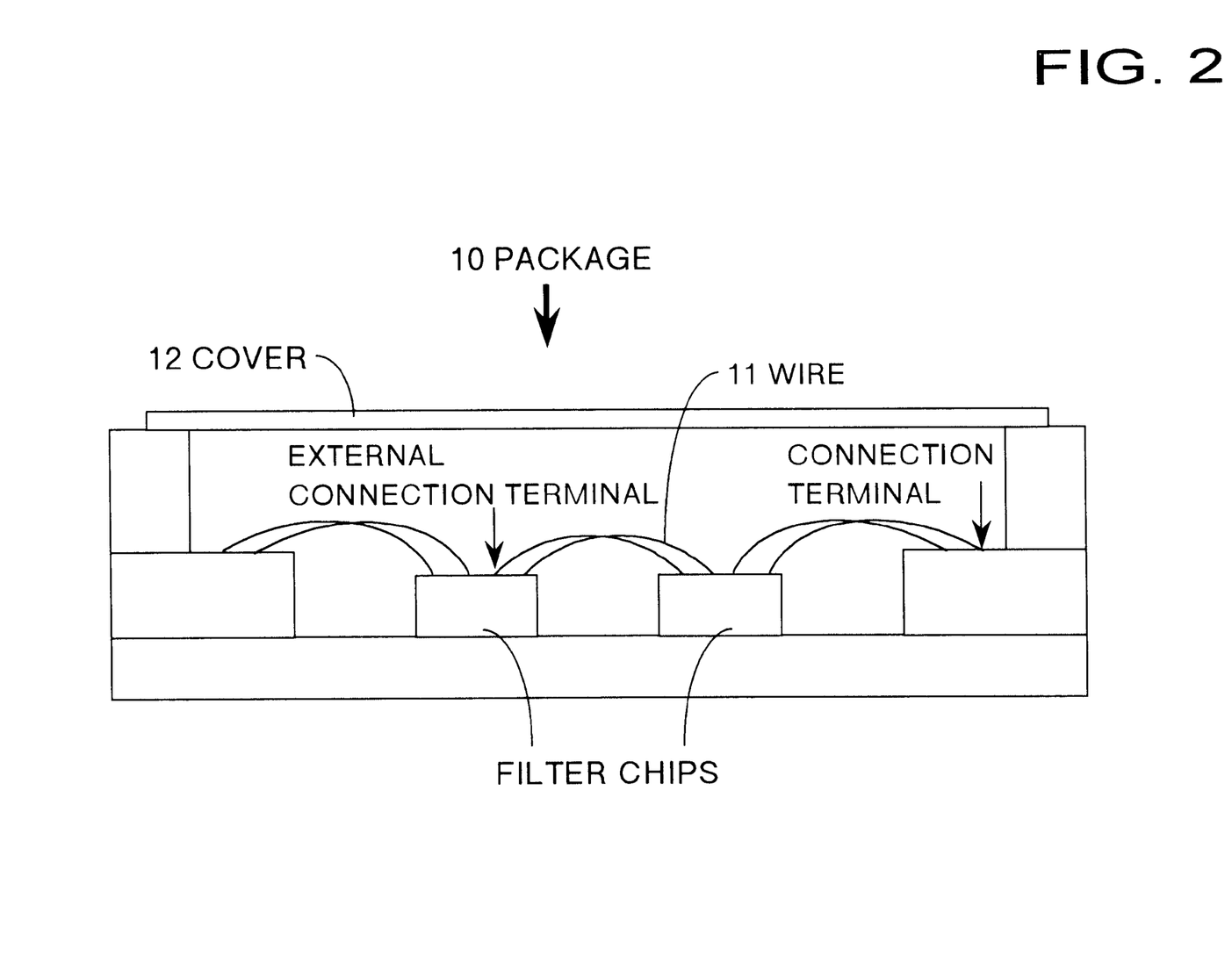
FIG. 2 is a schematic sectional view of a package of a SAW device seen from a side in accordance with the present invention.

FIG. 2 is a schematic sectional view of the package 10 of the SAW device shown in FIG. 1 in accordance with the present invention, seen from a side.

In the present invention, as shown in FIG. 2, the connection of a package terminal to a filter chip near to the package terminal and the connection between the filter chips are made directly using wires 11, but the wires 11 do not go over any filter chip to connect terminals. In other words, there are not direct connections by wires 11 which extend over the filter chips.

Figure 10:
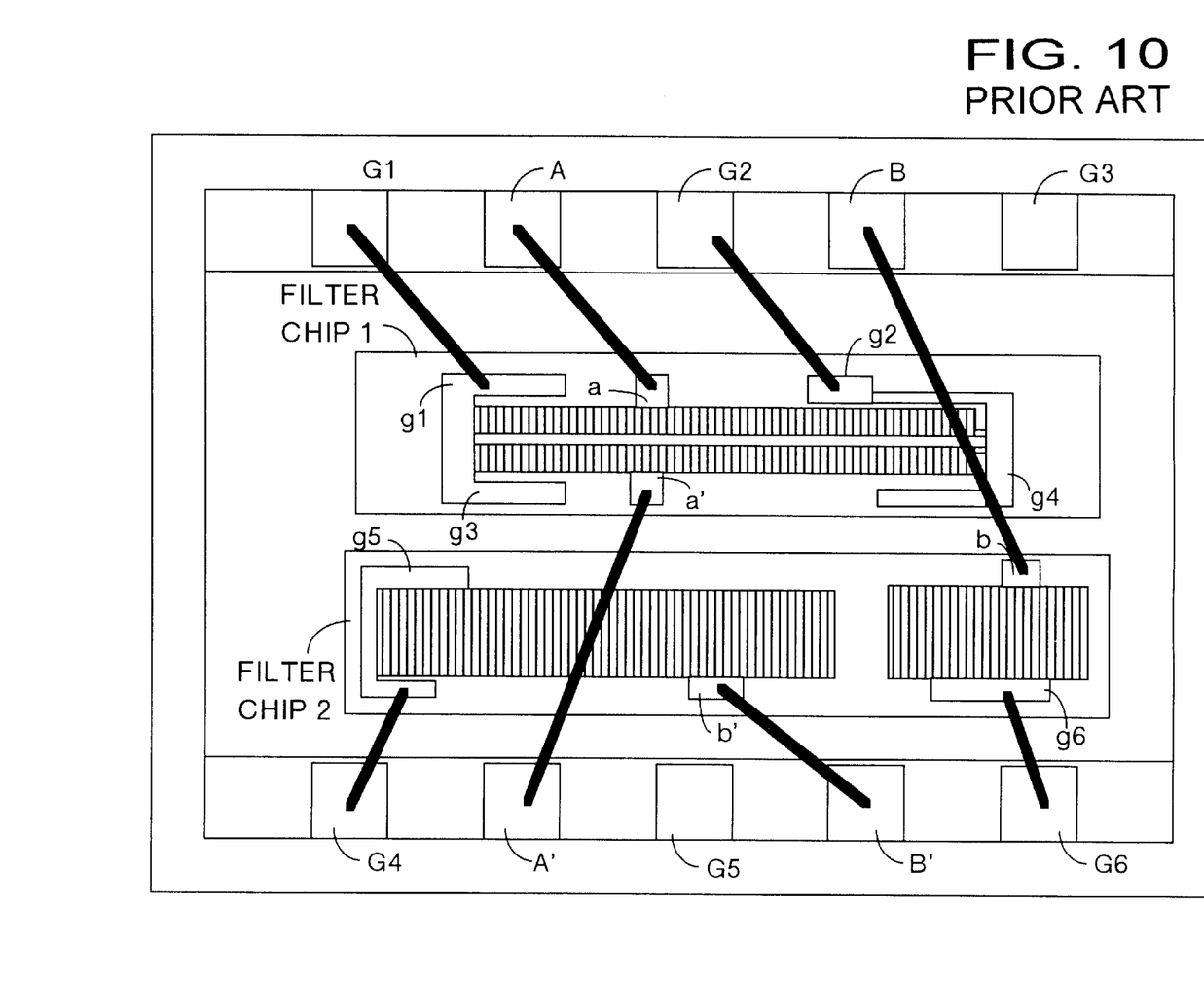
FIG. 10 is a schematic plan view of a package of a conventional SAW device seen from above the package.
Figure 11:
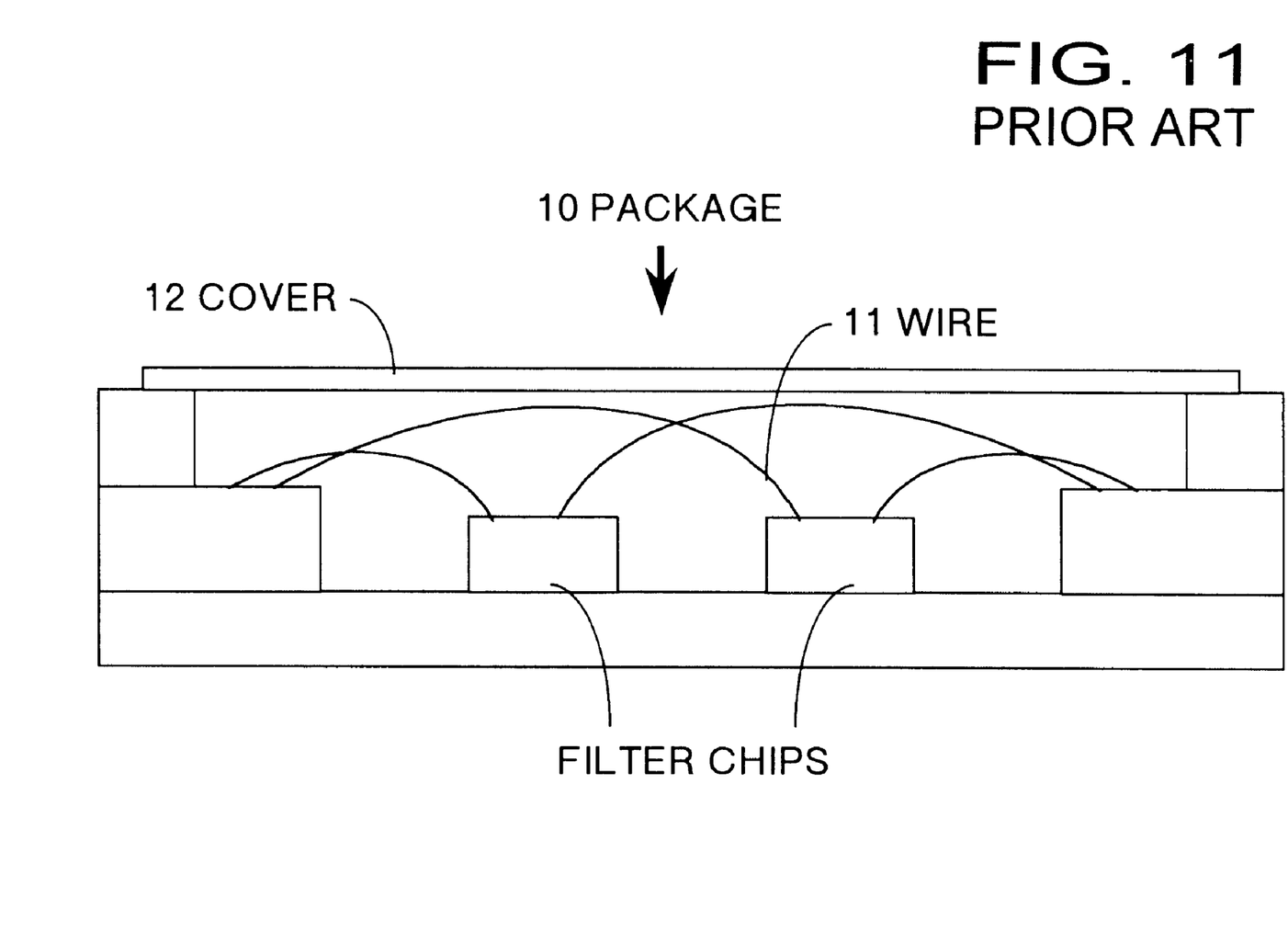
FIG. 11 is a schematic sectional view of a conventional SAW device seen from a side.

For comparison, exemplary wiring in the conventionally used SAW device is illustrated in FIGS. 10 and 11.

FIG. 10 is a schematic plan view of a package 10 of the conventional SAW device seen from above the package.

FIG. 11 corresponds to FIG. 2 and is a schematic sectional view of the conventional SAW device seen from a side.

Conventionally, as shown in FIG. 10, all terminals on the filter chips (a, a', b, b', g1, g2, g5, g6) are connected directly with package terminals (A, A', B, B'G1, G2, G4, G6) by wires 11. Especially, the terminal a' on the filter chip 1 is connected with the package terminal A' using an aerial wire 11 going over the filter chip 2, and the terminal b on the filter chip 2 is connected with the package terminal B using an aerial wire 11 going over the filter chip 1. In both cases, the aerial wires 11 are rather long. See FIG. 11.

If the number of filter chips mounted in the package 10 increases, the number of aerial wires which go over filter chips increases. Furthermore, the possibility that wires contact each other may increase depending on the location of package terminals.

The contact of wires could be avoided by tactfully arranging the terminals on the filter chips which are connected with the package terminals. However, since the filter characteristics of the filter chips are greatly affected by the positions of the terminals on the filter chips, there may be cases where desired filter characteristics cannot be realized.

On the other hand, if the positions of the terminals on the filter chips are determined so that the desired filter characteristics can be obtained with regard to all filter chips accommodated in one package 10, the conventional direct connection between the terminals on the filter chips and the package terminals gives rise to the problem of wires contacting. Thus, after all, due to various restrictions, the arrangement of the package terminals and the terminals on the filter chips is complicated or difficult, according to the conventional SAW device technique.

For the above-mentioned reasons, by executing the connection of terminals of the present invention as shown in FIG. 1, the wires can be reduced in length, compared with the conventional connection of terminals as shown in FIG. 10. Thus, the present invention can decrease factors affecting adversely the filter characteristics and contribute to improvement in the filter characteristics.

FIG. 1 illustrates the SAW device having a construction such that three filter chips are accommodated in one package. With such construction, the number of wires and that of terminals can be reduced compared with the case where the three filter chips are each accommodated in separate packages, and therefore it is possible to miniaturize the SAW device.

Especially, in the cases where a greater number of filter chips are accommodated in one package, the adoption of the construction of the present invention in which relay terminals are mounted on the filter chips as shown in FIG. 1 can contribute greatly to the miniaturization of the SAW device.

EMBODIMENT 1

Figure 3:
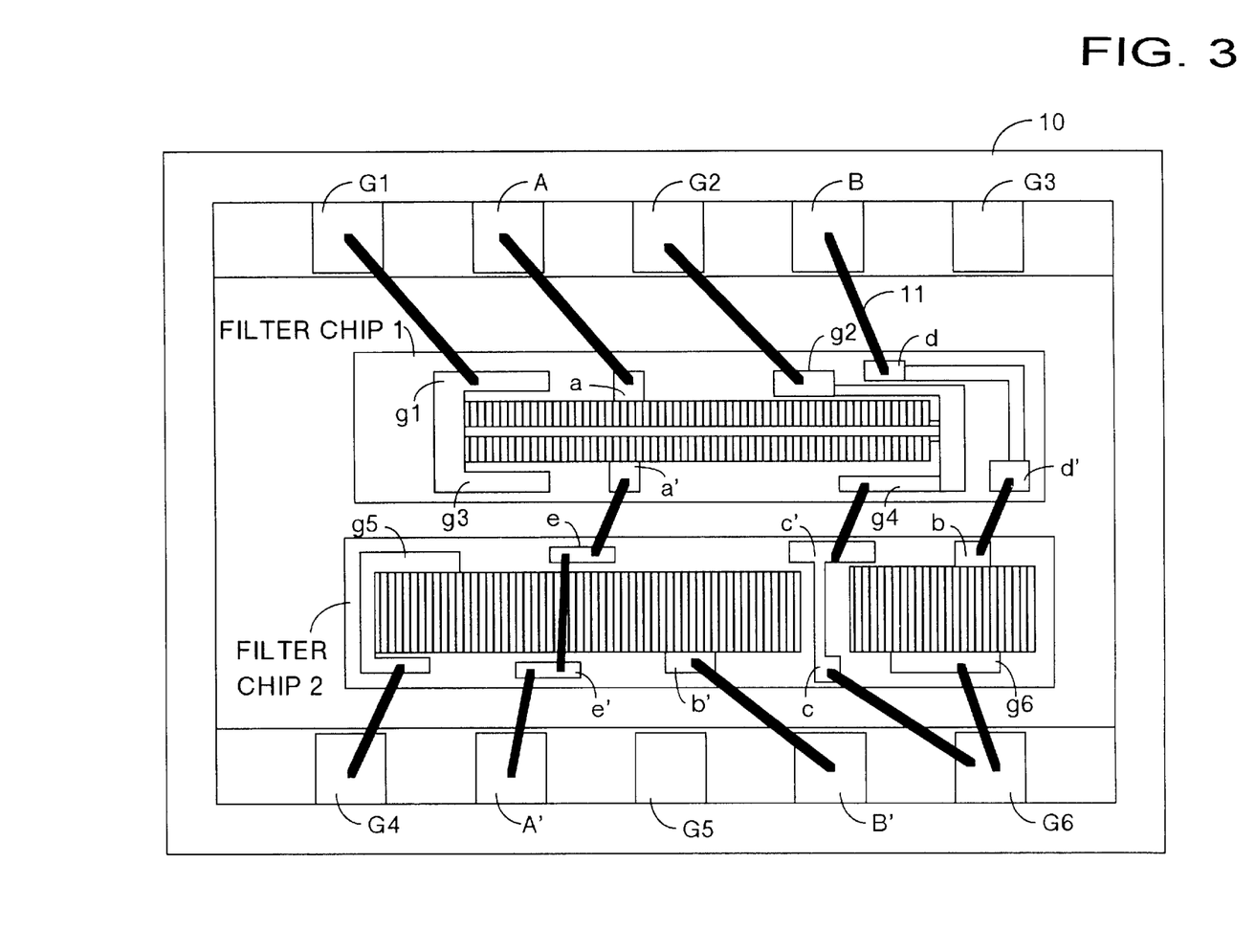
FIG. 3 is a schematic view illustrating the construction of a SAW device in accordance with Embodiment 1 of the present invention.

FIG. 3 is a schematic view illustrating the construction of a SAW device in accordance with Embodiment 1 of the present invention.

In the SAW device shown in FIG. 3, a filter chip 1 having a center frequency of 85 MHz and a pass band width of 30 KHz and a filter chip 2 having a center frequency of 85 MHz and a pass band width of 1.26 MHz are disposed in a ceramic package of SMD type of 13.3 mm×6.5 mm×1.2 mm in size.

These filter chips 1 and 2 are each composed of an IDT and a reflector which are formed by etching a film of aluminum or an aluminum alloy on a piezoelectric substrate (e.g., a quartz substrate). The filter chips are mounted to the package by an electrically conductive adhesive (e.g., Ag paste) and fixed to the package by thermodrying. On the filterchips, relay terminals and traces of a connection pattern are formed. Then, the package terminals are connected with the corresponding terminals on the filter chips by wire bonding and thus the SAW device is completed. It is noted that, in the case of a transversal filter chip 2 as shown in FIG. 3, an epoxy adhesive or a resin material such as a resist or ink is applied on end portions in a longitudinal direction of the chip for improvement of the filter characteristics.

The filter chip 1 shown in FIG. 3 is a mode coupling filter of transversal coupling type and the filter chip 2 may be a transversal filter using an excitation electrode whose input IDT and output IDT are weighted.

Because of restrictions for the filter characteristics, external terminals (a, a') of the filter chip 1 are located externally to the excitation electrode. The excitation electrode is located around the center in the longitudinal direction of the filter chip 1 and extends in the transverse direction. Terminals for grounding (g1, g2, g3, g4) are patterned in such places as to surround the excitation electrode as shown in FIG. 3.

On the other hand, input/output terminals (b, b') of the filter chips 2 are separated to the right and left in the longitudinal direction of the filter chip 2, and located externally to the excitation electrode in the transverse direction. Terminals for grounding (g5, g6) are patterned in positions as shown in FIG. 3 in view of the filter characteristics. The external connection terminals on the filter chips are each about 150 µm wide and about 200 µm to 400 µm long.

The package terminals, on the other hand, includes terminals (A, B, A', B') for outputting/inputting signals and terminals (G1, G2, G3, G4, G5, G6) for grounding arranged at spaced intervals along side portions in the longitudinal direction of the package. Here, the terminals for grounding and the terminals for inputting/outputting are alternately located, but that is not limitative.

The connection of the package terminals with the terminals on the filter chips may be done by direct connection by wire bonding or via relay terminals on the filter chips.

In this embodiment, the relay terminals (c, c', d, d', e, e') are provided in the positions shown in FIG. 3. The relays terminals c and c', d and d', and e and e' are connected by patterning in the filter chip.

The direct wiring by wire bonding is carried out in the case where there is nothing that will cause harm by contact with a wire between two terminals to be connected, the distance between the two terminals is relatively small and a long wire is not needed for connection.

For example, in FIG. 3, since the terminals G1 and g1, A and a, G2 and g2, G4 and g5, B' and b', and G6 and g6 meet the above-discussed requirements, these pairs of terminals are directly connected using wire bonding.

On the other hand, suppose that the terminal a' of the filter chip 1, the terminal g4 of the filter chip 1 and the terminal b of the filter chip 2 need to be connected with the package terminals A', G6 and B, respectively. If these terminals are connected directly by wire bonding, some patterns will contact connecting wires between the terminals to cause trouble and further long wires are required for the direct connection. Therefore, the relays terminals are used for contacting these terminals.

As shown in FIG. 3, The terminal A' and a' are connected via the relay terminals e and e'. Here, a' and e, e and e', and e' and A' are directly connected by wire bonding.

Similarly, the terminals b and B are connected via the relay terminals d and d', and the terminals g4 and G6 are connected via the relay terminals c and c'.

The terminals b and B, for example, are connected by the path B-d-d'-b. The path itself is longer compared with the case where the terminals b and B are directly connected by one wire, but only B-d and d'-b are connected by wires, and the length of the wires is shorter in total than said one wire directly connecting the terminals b and B. Thus, the length of wires, which adversely affect the filter characteristics, can be reduced, and therefore the characteristics of the filter chips can be improved.

Figure 4:
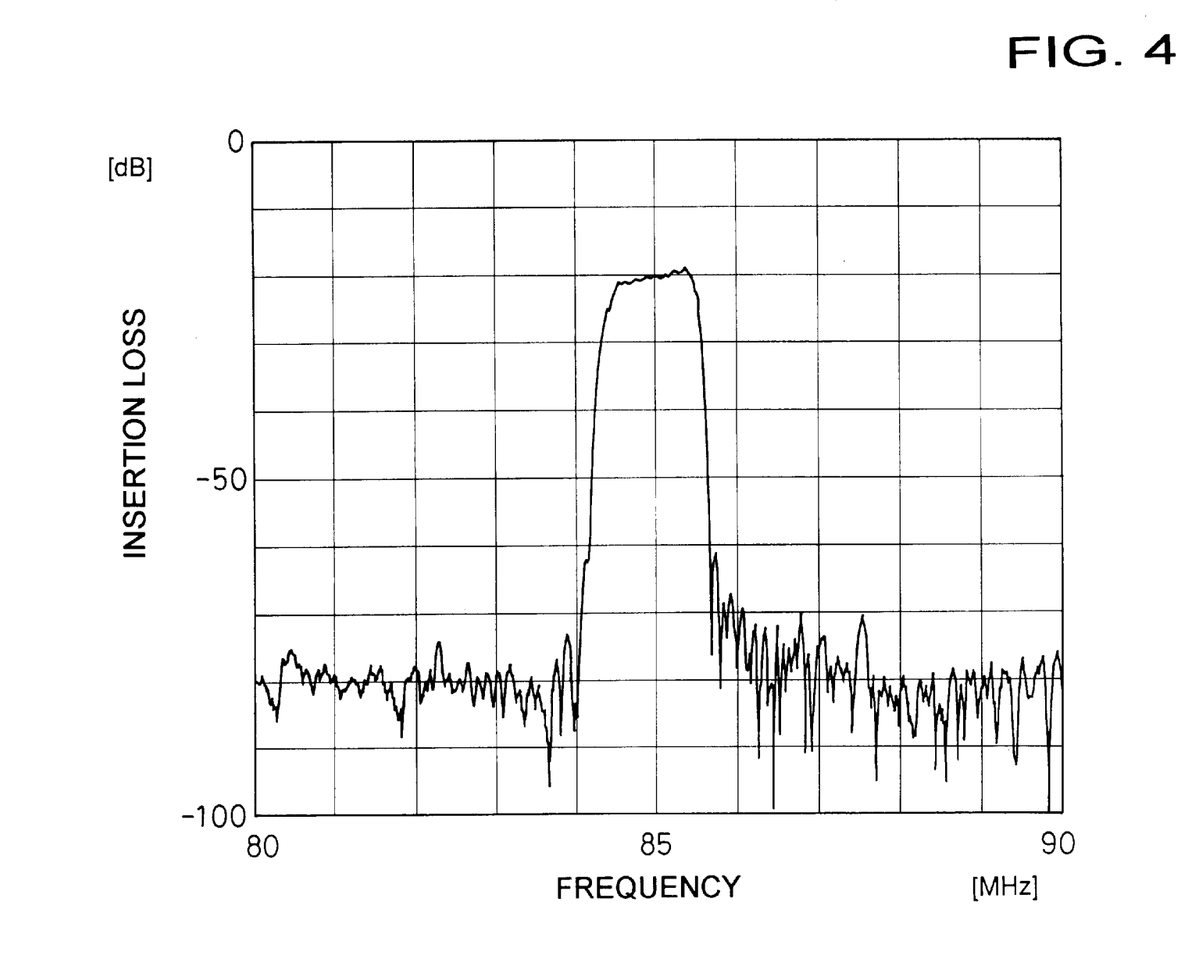
FIG. 4 is a graph representing a filter characteristic of filter chip 2 shown in FIG. 3 in accordance with the present invention.
Figure 5:
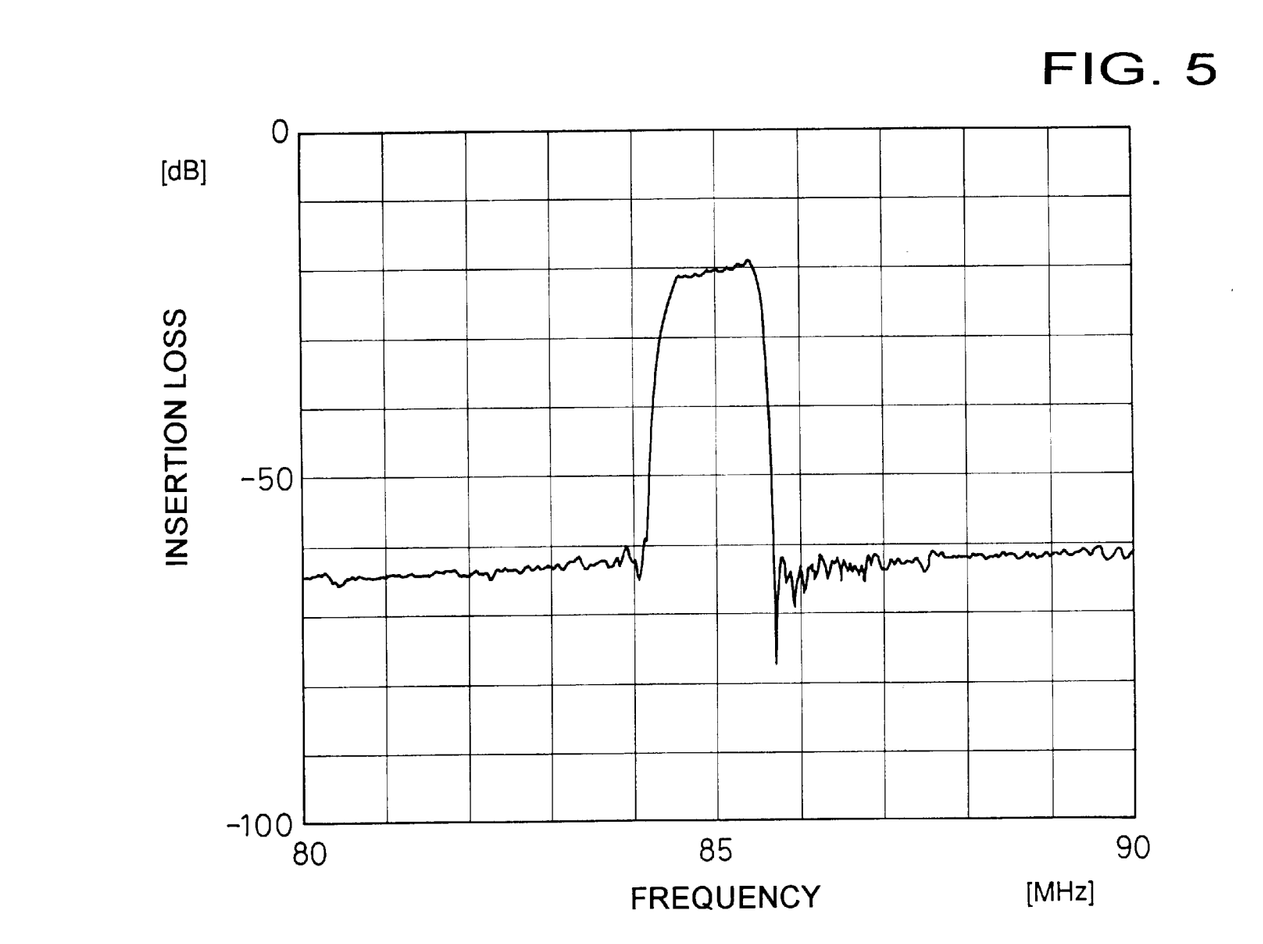
FIG. 5 is a graph representing the filter characteristic of a conventional counterpart of filter chip 2 in correspondence to FIG. 4.

FIGS. 4 and 5 show comparative filter characteristics of the filter chip 2.

FIG. 4 is a graph representing the filter characteristic of the filter chip 2 shown in FIG. 3 in accordance with the present invention.

FIG. 5 is a graph representing the filter characteristic of filter chip 2 in the case where the terminals are directly connected only by wire bonding without using relay terminals.

Attenuation amount outside the pass band is about 60 dB to about 70 dB in FIG. 5, while the attenuation amount outside the pass band is about 70 dB to about 90 dB in FIG. 4 using the construction of the present invention.

From comparison of the two figures, it is found that the filter characteristic of the SAW filter outside the pass band (i.e., bands other than the band of 84 MHz to 86 MHz) can be improved about 10 dB by providing relay terminals on the filter chips and connecting package terminals with terminals on the filter chips via the relay terminals.

In the above described Embodiment 1, since some of the external terminals on the filter chips are connected with the corresponding package terminals via the relay terminals mounted on filter chips other than the respective filter chips, the filter characteristic of the SAW device can be improved.

Figure 6:
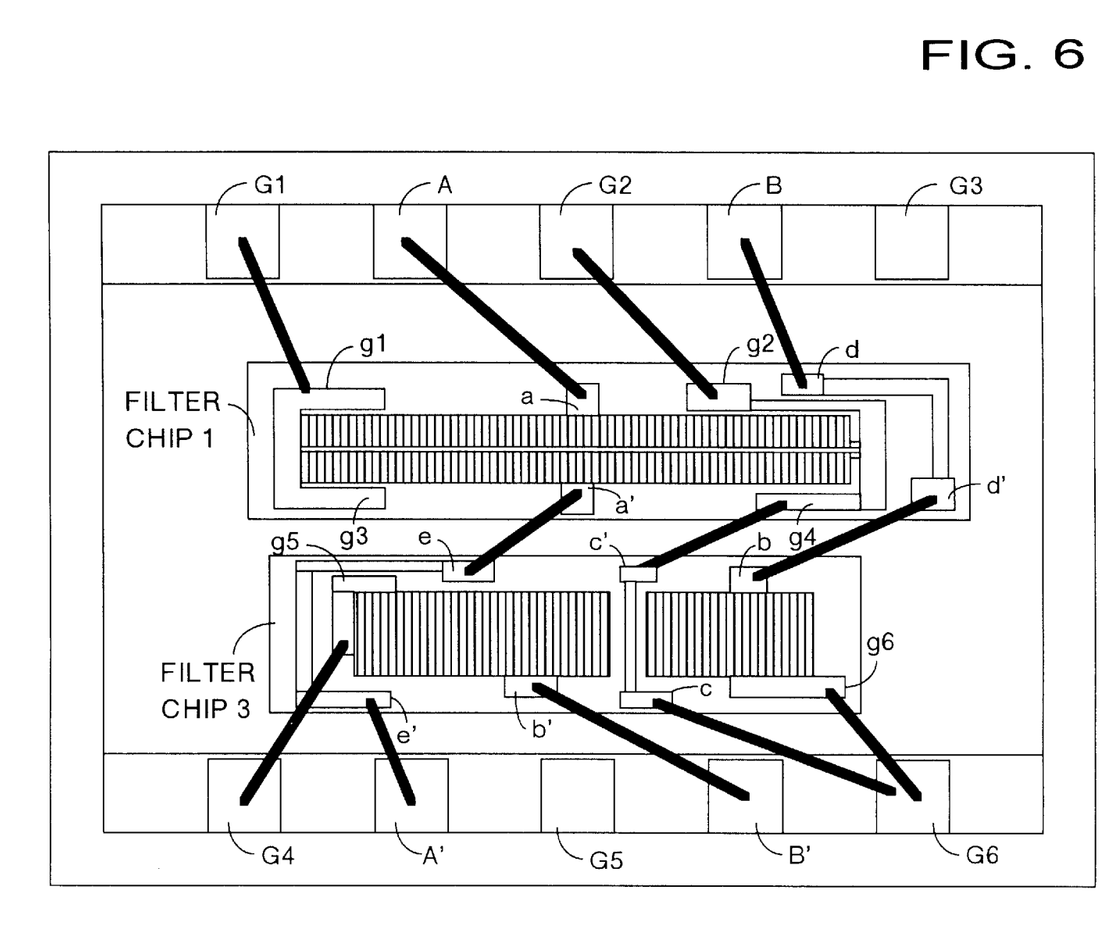
FIG. 6 is a schematic view illustrating the construction of a SAW device in accordance with Embodiment 2 of the present invention.

FIG. 6 is a schematic view illustrating the construction of a SAW device in accordance with Embodiment 2 of the present invention.

The SAW device shown in FIG. 6 includes the filter chip 1 used in the SAW device shown in FIG. 3 and a filter chip 3 having a center frequency of 209 MHz and a pass band width of 1.26 MHz both accommodated in one package. The filter chip 3 is about 2 mm shorter than the filter chip 2 in length since the filter chip 3 has a higher center frequency.

Connection shown in FIG. 6 is different from that shown in FIG. 3 in connection between the package terminal A' and the terminal a' on the filter chip 1. More particularly, the relay terminals e and e' on the filter chip 3 are connected by patterning on the filter chip in FIG. 6.

Here, since the distance between the excitation electrodes located separately to the right and left on the filter chip 3 is small, a pattern between the relay terminals e and e' is formed to go externally to the excitation electrode on the left, i.e., to go along the left edge of the filter chip.

The relay terminals e and e' are connected with each other directly using a wire in FIG. 3, while the wire between the relay terminals e and e' are not required in the connection shown in FIG. 6. Thus, connection using wires, which have adverse effect, can be reduced. Therefore, the filter characteristics can be improved.

Figure 7:
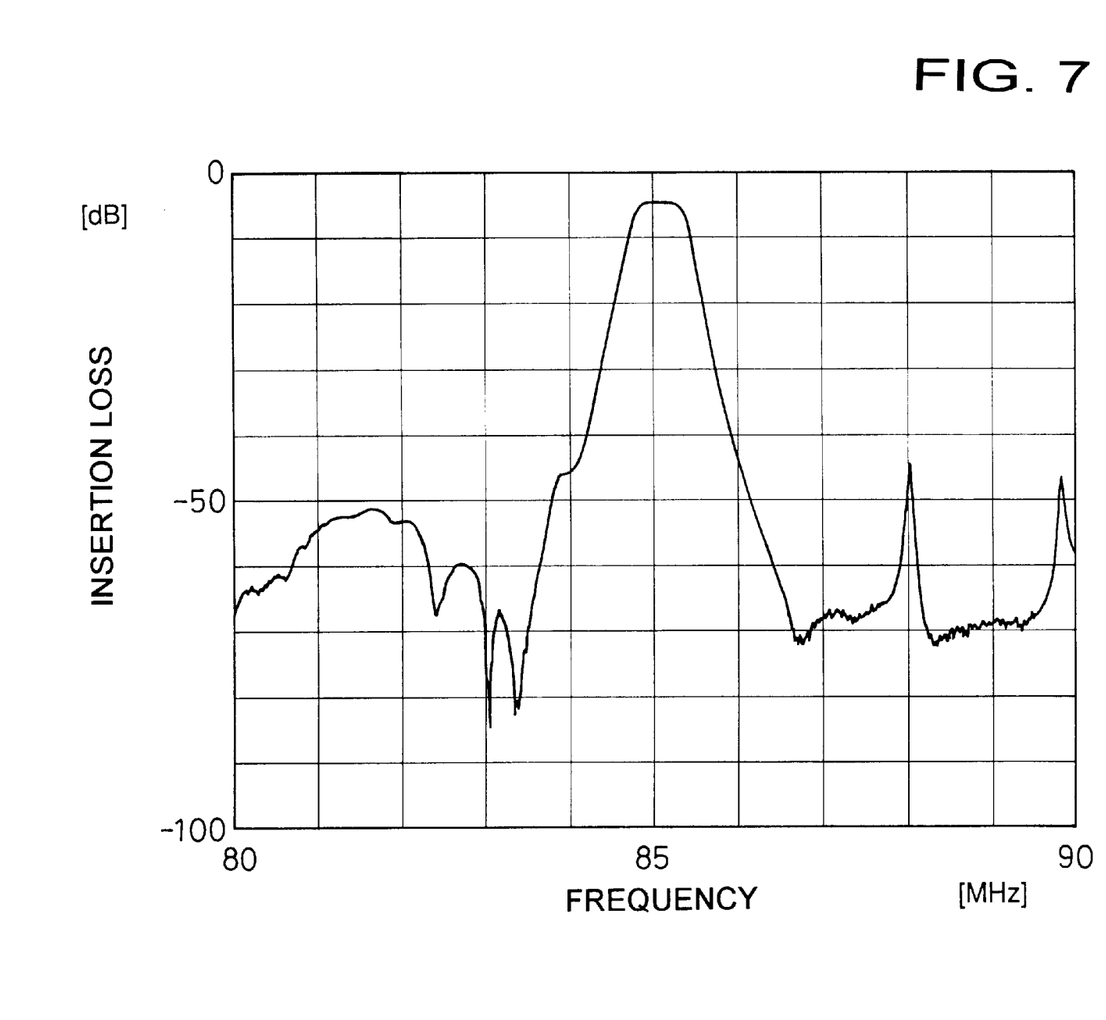
FIG. 7 is a graph representing the filter characteristic of filter chip 1 shown in FIG. 6 in accordance with the present invention.
Figure 8:
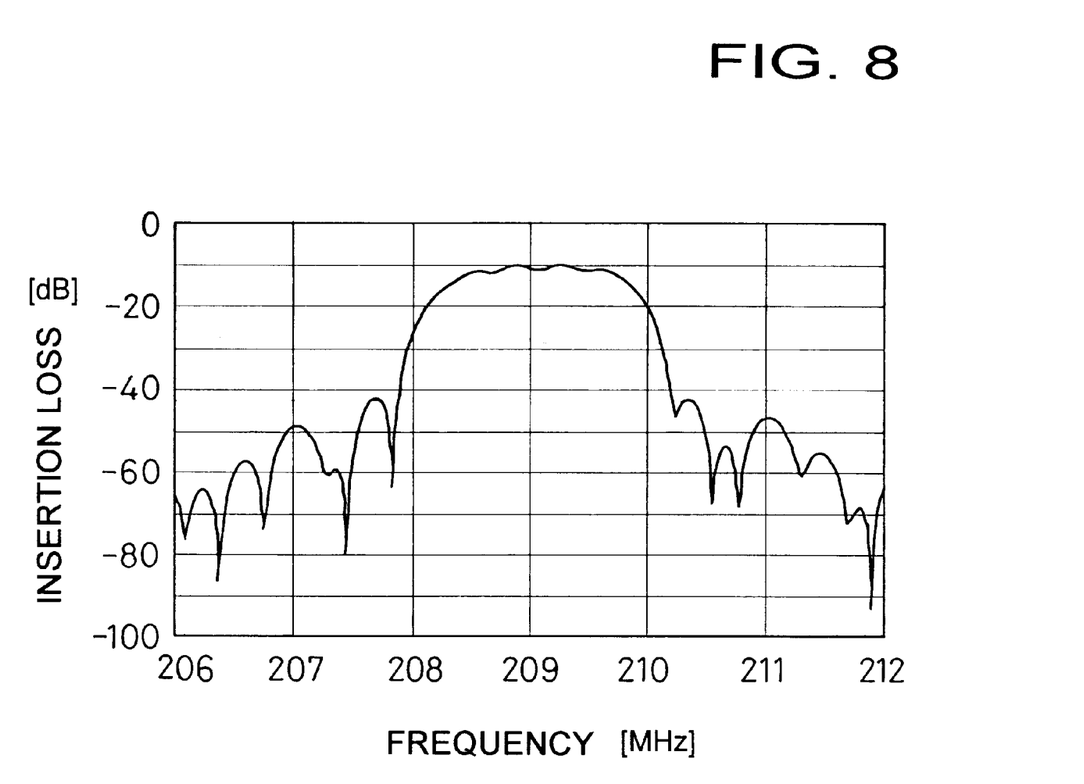
FIG. 8 is a graph representing the filter characteristic of filter chip 3 shown in FIG. 6 in accordance with the present invention.

FIGS. 7 and 8 are graphs representing the filter characteristics of the filter chips 1 and 3 in Embodiment 2 of the present invention.

According to FIG. 7, the attenuation amount outside the bass band is found about −50 dB or less, and according to FIG. 8, the attenuation amount outside the bass band is found about −40 dB or less. Both the filter chips have a satisfactory attenuation characteristic as a SAW filter for use in a mobile communication system.

Figure 9:
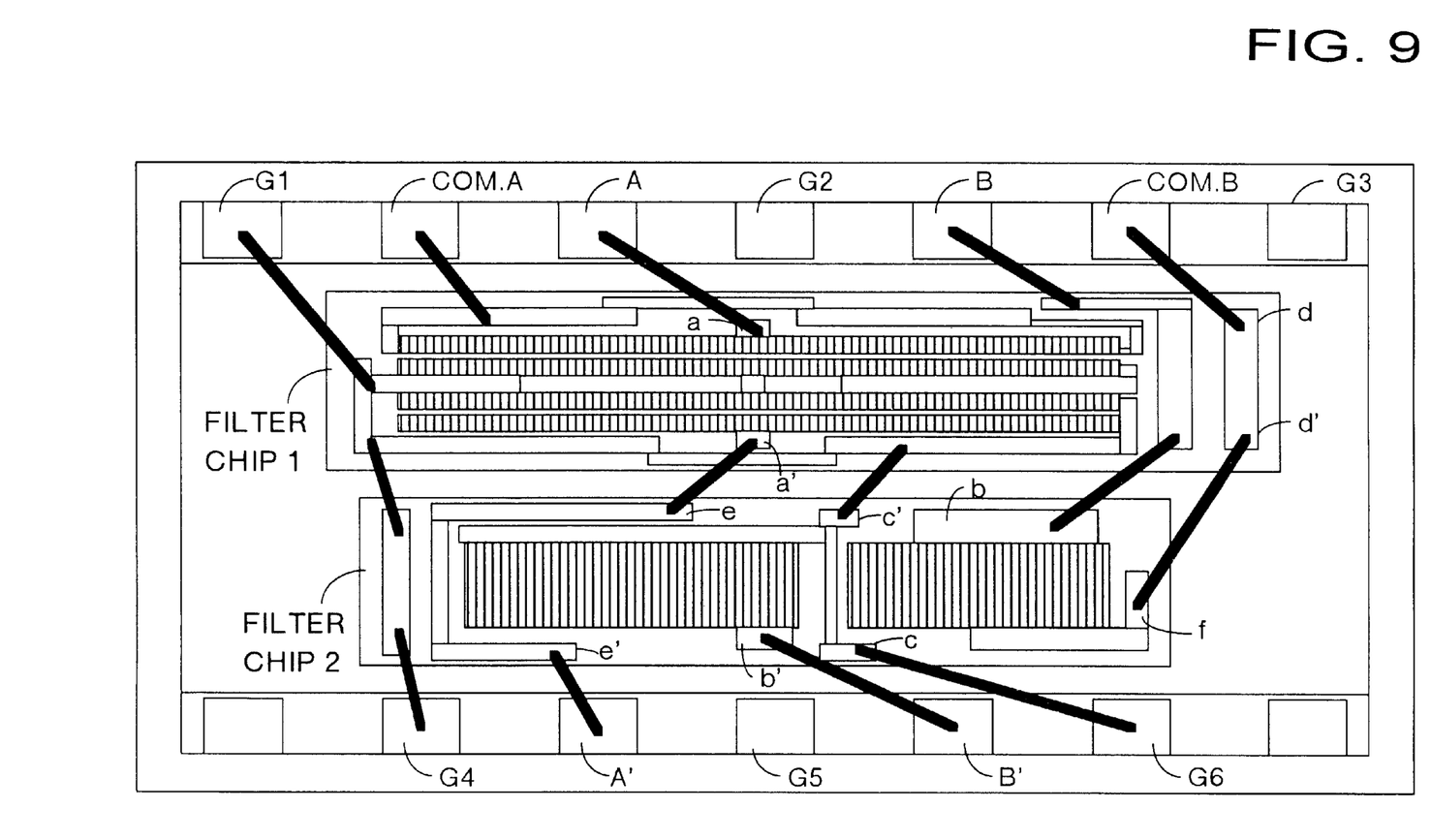
FIG. 9 is a schematic view illustrating the construction of a SAW device in accordance with Embodiment 3 of the present invention.

FIG. 9 is a schematic view illustrating the construction of a SAW device in accordance with Embodiment 3 of the present invention.

Filter chips 1 and 2 shown in FIG. 9 are filters having the same center frequency and pass band width as the filter chips shown in FIG. 3, but are different in that one terminal of each of the filter chips 1 and 2 is a balanced type terminal and other terminal is an unbalanced type terminal. As the package, used is a ceramic package of an SMD type having a size of 19.0 mm×8.0 mm×1.4 mm.

In FIG. 9, the filter chip 1 is composed of a multi-mode filter of transversal coupling type in which two SAW filters are connected in the vertical direction in the figure. Usable as this filter chip 1 is a filter shown in FIG. 24 of Japanese Unexamined Patent Publication No. HEI 10(1998)-32463.

In the upper SAW filter of the filter chip 1, a terminal a and a package terminal A are connected with each other directly using a wire, and a portion of one excitation electrode is connected with a package terminal COM.A using a wire via conductor routing. The terminal A and the COM.A terminal compose a balanced type terminal.

In the lower SAW filter of the filter chip 1, on the other hand, a terminal a' and a package terminal A' are connected via relay terminals e and e' on the filter chip 2 and a pattern on the filter chip 2, and a portion of one excitation electrode is connected with package electrodes G1, G4 and G6. Here, the connection with package electrodes G4 and G6 are made via patterns on the filter chip 2 and relay terminals c and c' on the filter chip 2. The terminal A' and the terminals G4 and G6 compose an unbalanced type terminal.

In FIG. 9, the filter chip 2 is a SAW filter of transversal type composed of two excitation electrodes placed in a right-to-left direction. Package electrodes B' and G6 which are connected to the excitation electrode on the left compose an unbalanced type terminal, and package terminals B and COM.B which are connected with the excitation electrode on the right compose a balanced type terminal.

A terminal b on the filter chip 2 is connected with the package terminal B via a pattern on the filter chip 1, and a terminal f connected to a lower portion of the excitation electrode on the right is connected with the terminal COM.B via relay terminals d and d' on the filter chip 1.

A terminal b' connected to a lower portion of the excitation electrode on the left is connected with a package terminal B' directly using a wire, and a terminal c' connected with an upper portion of the excitation electrode on the left is connected with the package terminal G6 via a relay terminal c.

In FIG. 9, the terminal a' on the filter chip 1 and the package A', the terminal b on the filter chip 2 and the package terminal B, and the terminal f on the filter chip 2 and the package terminal COM.B are connected via the relay terminals on the filter chips and patterns on the filter chips. Accordingly, compared with the case where they are connected directly using wires, the length of wires can be reduced.

Therefore, also in Embodiment 3, since the length of wires can be decreased, the filter characteristics of the filter chips 1 and 2 can be improved.

According to the present invention, since the external connection terminals on a SAW filter chip and the connection terminals on the package are connected via another SAW filter, the length of wires used for direct wiring can be reduced, the filter characteristics of the SAW device can be improved and the miniaturization of the device is possible.

What is claimed is:

1. A surface acoustic wave device comprising:

a plurality of surface acoustic wave filter chips having external connection terminals; and a package accommodating said surface acoustic wave filter chips, wherein
        the package is provided with a plurality of terminals for connection with said surface acoustic wave filter chips, and
        a second one of said surface acoustic wave filter chips which is different from a first one of said surface acoustic wave filter chips is provided with a relay terminal, and the external connection terminal of the first surface acoustic wave filter chip is connected with one of the terminals of the package via the relay terminal.

2. The surface acoustic wave device according to claim 1, wherein said plurality of surface acoustic wave filter chips include band pass filters.

3. The surface acoustic wave device according to claim 2, wherein said plurality of surface acoustic wave filter chips have a same center frequency and said plurality of surface acoustic wave filter chips have at least two different pass band widths.

4. The surface acoustic wave device according to claim 2, wherein said plurality of surface acoustic wave filter chips have a same pass band width and said plurality of surface acoustic wave filter chips have at least two different center frequencies.

5. The surface acoustic wave device according to claim 2, wherein said plurality of surface acoustic wave filter chips have at least two different center frequencies and at least two different pass band widths.

6. The surface acoustic wave device according to claim 2, wherein at least one of the external connection terminals of at least one of said plurality of surface acoustic wave filter chips is a terminal of balanced type.

* * * * *